May 20, 1969 R. M. SONKIN 3,445,782
HIGH-POWER AMPLIFIER UTILIZING HYBRID COMBINING CIRCUITS
Filed July 28, 1966
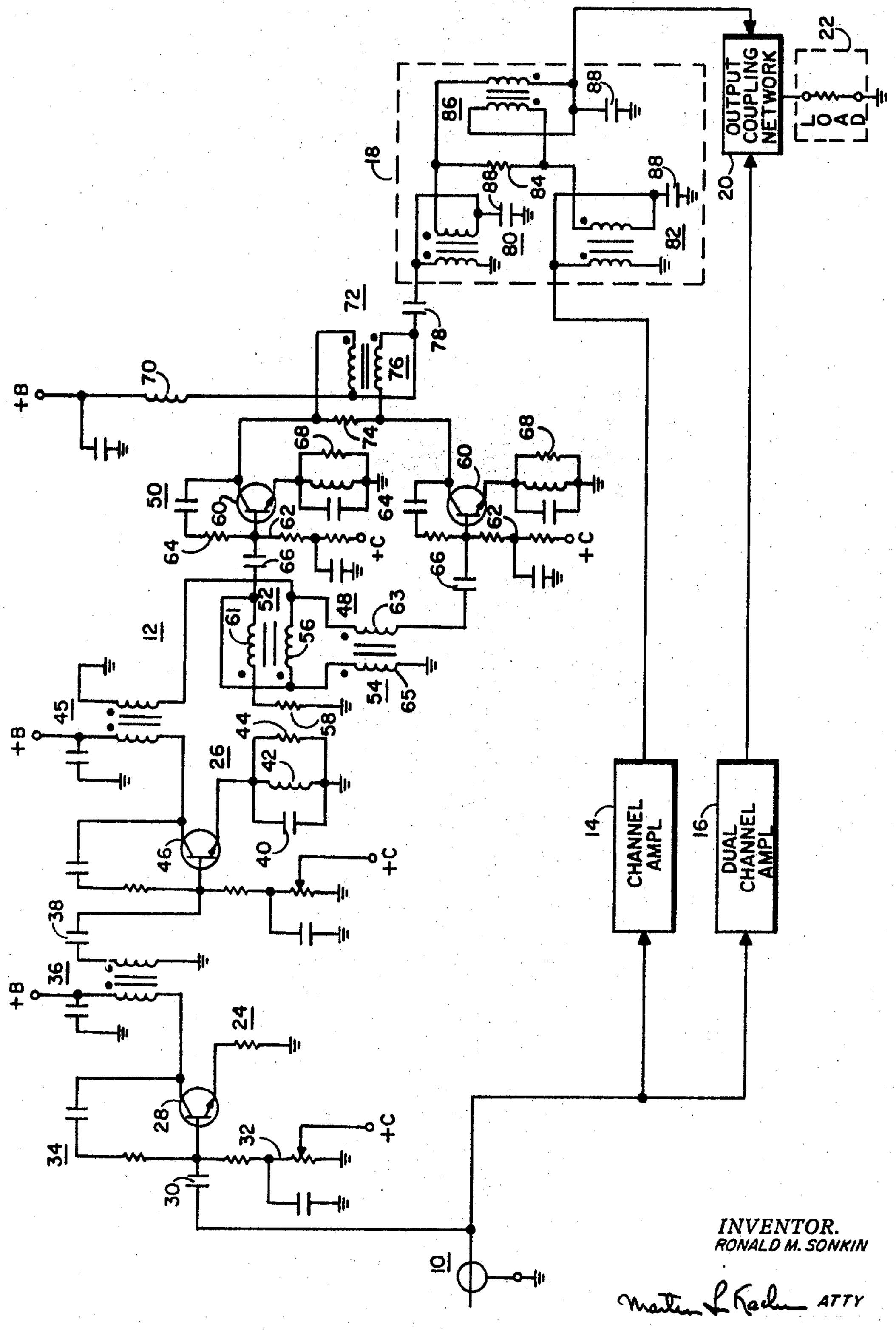
INVENTOR.
RONALD M. SONKIN
Martin L. Kacher ATTY United States Patent Office 3,445,782
Patented May 20, 1969

3,445,782

HIGH-POWER AMPLIFIER UTILIZING HYBRID COMBINING CIRCUITS

Ronald M. Sonkin, Pittsford, N.Y., assignor to General Dynamics Corporation, a corporation of Delaware Filed July 28, 1966, Ser. No. 568,550
Int. Cl. H03f 3/68, 3/04
U.S. Cl. 330—124 6 Claims

ABSTRACT OF THE DISCLOSURE

A high-power amplifier is disclosed which has linear frequency and phase characteristics over the entire high frequency radio band. Many individual low power transistor amplifier stages having inputs and outputs are used. Hybrid circuits combine the outputs of different pairs of stages. Coupling networks containing hybrid circuits in turn couple different pairs of the combined outputs to provide set outputs. An output coupling network, also containing a hybrid circuit, combines the set output. Thus, should any amplifier stage fail, the power output will be reduced, but the waveform integrity and power outputs of the remaining stages will not be altered.

The present invention relates to amplifier systems and circuits. More particularly, the invention relates to a high-power amplifier which is operative over a wide band of signal frequencies.

The present invention is particularly suitable for use in applications where high-power linear amplification is desired through the use of low power amplifying elements, such as transistors. The invention is generally applicable for use in amplifier systems for such purposes as repeaters, broadcasting, signal generation, countermeasures, and radio communications. Transistors which can operate at high frequency generally have low power handling capacity. Such transistors are also frequency sensitive and do not afford a linear frequency and phase response characteristic over a wide band of frequencies, say over the entire high frequency radio band.

Several transistors may be used in parallel so that their power outputs are combined in order to obtain high power from low power transistors. However, combination of outputs in this manner is not generally compatible with a broadband response characteristic inasmuch as the effective reactance of the transistors militates against broadband operation.

Accordingly it is an object of the present invention to provide an improved power amplifier which is adapted to be minaturized so as to occupy a relatively small amount of space for the power output produced.

It is a still further object of the present invention to provide an improved power amplifier, utilizing relatively low power and low cost transistors, which has a linear amplification characteristic both as regards gain and phase over a broadband of frequencies which may cover twenty or more octaves.

It is a further object of the present invention to provide an improved power amplifier which is reliable in operation and is capable of operating not withstanding failure of some of the amplifying elements used therein.

Briefly described an amplifying system embodying the invention may include a plurality of amplification channels arranged somewhat in a pyramidal structure wherein output coupling networks combine pairs of channels into a single output. The individual channels include at least one pair of transistors which are input connected to the source of signals to be amplified. A hybrid transformer network interconnects the outputs of the transistors in balanced relationship and provides a single output to the coupling network. The coupling network may include a plurality of other transformers which couple the output of another similar individual channel with the aforementioned channel. Specifically, the hybrid transformer network may include a hybrid transformer having windings connected in aiding relation with respect to the transformer output. Different windings are connected to the output electrodes of different ones of the transistors. Out of phase and unbalanced components pass through a dummy load resistor connected between the transformer outputs. The transformer itself is wound to provide linear operation both as regards amplification and phase over a wide band of frequencies. The transformers also provide for isolation and impedance matching between stages thereby permitting iteration of stages for increased power output. The transistors are independently connected to the transformer output and share a common input circuit. Accordingly, a failure in one transistor does not disable the channel so that the system reliability is a function of the reliability of more than one transistor.

The system can use hybrid transformer coupling networks for inter-stage coupling and impedance transformation purposes to the end that broad band high-power output is obtained.

The foregoing and other objects and advantages of this invention will be further apparent from a reading of the following description when taken in connection with the accompanying drawing, the sole figure of which is a diagram partially in block and partially in schematic form, illustrating an amplifier system which embodies the present invention.

An input signal may be applied to a single ended input 10 of the amplifier by way of a coaxial cable. The amplifier itself is illustrated as having four channels 12, 14 and 16; the channel 16 being a dual channel. Channel 12 is shown in detail. Channel 14 may be identical to channel 12. Channel 16 may be identical to channels 12 and 14 and their output coupling network 18 all taken together. An output network 18 of the pair 12 and 14 is combined with the dual channel 16 output in an output coupling network 20 which in turn is connected to a load 22, illustrated as a resistor. The load may, however, be an antenna, transmission line, or other utilization device. It will be observed that the various channels are structured in pyramidal fashion; that is subsequent pairs of channels 12 and 14 are combined with other channel pairs, say 16 by way of output coupling networks to obtain a single output.

In lieu of the output network coupling 20 there may be provided another pair of channel amplifiers. One of these channel amplifiers may be interconnected to the output of the coupling network 18 while the other input is connected to the output of the dual channel amplifier 16 coupling network. An output coupling network similar to the network 18 may then be used to derive a single output from the additional pair of channels. It will be appreciated that this pyramidal configuration may be used to provide increased power output from the amplifier system.

The circuitry of the channels will be more apparent from the following description of the upper channel 12. First stage 24 includes a transistor 28 which is base connected to the input 10 by way of a coupling capacitor 30. A biasing network 32 is connected to the base of the transistor 28 and applies bias potentials thereto from a cource of operating voltage indicated at +C. The frequency response of the transistor is stabilized by means of a feedback network 34 which connects the collector to the base. The collector of the transistor is connected to the next stage 26 by way of a coupling transformer 36 and coupling capacitor 38. The coupling transformer 36 is similar to the other transformers which are used in the system and may be a one to one transformer provided by a pair of bifilar windings around a toroidal core of ferrite material. This material may be a high permeability ferrite such as 3E2A ferrite manufactured by Ferroxcube, Saugerties, N.Y. or Cerramag 24, manufactured by Stackpole Carbon Co., St. Mary's, Pa. These transformers have a linear response characteristic both as regards amplitude and phase over a broad band of frequency, say the entire high frequency band from one to thirty-five mc./s., by reason of the coupling characteristics of the core which provides a high coefficient of coupling in the low frequency part of the band and the bifilar winding which provides a sufficiently high coefficient of coupling in the high frequency part of the band. Thus the overall phase and amplitude response of the transformer is substantially linear over the entire frequency band. Operating voltage for the transistor is obtained from a source at B+ and is applied to the collector of the transistor 28 by way of the primary of the transformer 36. The amplifier 24 may be operated in class A or in AB by selecting the desired bias voltage through the use of the potentiometer in the network 32.

The amplifier stage 26 is similar to the stage 24 with the difference that a peaking circuit including a capacitor 40 and inductor 42 and a resistor 44 are connected between the emitter of the transistor 46 of the stage 26 and ground. This peaking circuit is tuned to a frequency near the high end of the band and does not affect amplifier response in the low end of the band.

The output of stage 26 is connected to a transformer network 48 which transforms the single ended output into a pair of outputs (viz. a double ended or balanced output) and provides impedance transformation to match the output impedance of the stage 26 to the input impedance of a pair of further amplifier stages 50.

The transformer network 48 includes a pair of transformers 52 and 54. Both transformers may have a one to one transformation ratio and can be constructed similarly with the transformer 36. The transformers 52 and 54 are hybrid connected so that any output taken across the winding 56 of the transformer 52 is balanced with respect to the input of the transformer (viz. the input to the network 48 which arrives from the output transformer 45 of the amplifier stage 26). A resistor 58, connected to the secondary winding 61 of the transformer 52, has a resistance equal to the output impedance of the amplifier 26. The pair of amplifier stages 50 each have an input impedance equal to half the output impedance of the stage 26. It will be observed from the winding sense indications on the ends of the windings of the transformers 52 and 54 that the double ended outputs which are obtained from the secondary 61 of the transformer 52 and the secondary 63 of the transformer 54 will be in phase and balanced with respect to ground. The windings 56 and 61 are effectively connected in series with respect to the output of the amplifier 26. The input impedances of each of the transistors 60 of the stage 50 therefore are additive. Accordingly, the stage 50 input impedance is matched to stage 26 output impedance by the network 48. Since the transformers in the network 48 have a linear amplitude and phase response over the band, the network 48 provides the desired input connection to the stage 50 when the amplifier stages 26 and 28 are utilized.

The amplifier stages 24 and 26 provide the desired gain for driving the transistors in the amplifier stage 50 with the input signal which arrives at terminal 10. In the event that the input signal is of sufficient magnitude or the amplifier stage 50 is designed to operate with lower amplitude drive signals, the stages 24 and 26 need not be used. While the transformation network 48 may similarly be dispensed with, its use is preferable where a single ended output is converted to a double ended input and impedance transformation is needed. The amplifier stage 50 includes a pair of transistors 60 each in its own circuit. A biasing network 62 is connected to the base of these transistors and feedback networks 64 are connected between collector and base thereof. Input signals are obtained from the transformer network 48 by way of coupling capacitors 66. Peaking networks 68 similar to the network in the stage 26 are connected between the emitters and ground of the transistors 60. Operating voltage from the source at +B are applied to the transistors 60 by way of a choke 70 and a hybrid transformer output coupling network 72.

A resistor 74 in the network 72 is connected between the collectors of the transistor 60. By virture of hybrid connection of the transformer 76 of the network 72, the resistor 74 is balanced both with respect to the collectors of the transistor 60 and the output of the transformer network 72. Accordingly any components of the signal amplified in the transistors 60 which are unbalanced in amplitude or phase, pass through the resistor 74.

The transformer network 72 and the coupling networks 18 and 20 provide for impedance matching so as to present to the transistors 60 a desired value of load resistance with which to operate by reflecting the impedance of the load 22 and transforming that impedance to the desired value. For the sake of illustration the load 22 will be assumed to have a resistance of 100 ohms and the transistors, an output resistance of 50 ohms. The transformer network 72 provides a two to one impedance transformation ratio. By virtue of the balanced connection of the windings of the transformer 76, the impedance presented at the output of the transformer network 72 is half the value of the desired load impedance of the transistors 60 or 25 ohms. The coupling capacitor 78 connects the output of the network 72 to the input of the coupling network 18. The coupling network 18 also receives an input from channel 14 which as mentioned above may be identical to the channel amplifier 12.

The coupling network 18 includes a pair of transformer 80 and 82 respectively connected as auto transformers to the outputs of the channels 12 and 14. The transformers 80 and 82 provide balanced input across a dummy load resistor 84 of another hybrid connected transformer 86 which provides the combined outputs of the channels 12 and 14 to the output coupling network 20. Capacitors 88 which are connected between ground and the windings of the transformers 82 and 86 provide some peaking action for the high frequencies and therefore improves the frequency response of the system. All of the transformers 80, 82 and 86 may have a one to one transformation ratio.

It will be observed that the windings of the transformer 80 and 82 are connected in series with respect to the output of these transformers. Thus the impedance presented at the outputs of these transformers (viz. at each input to the input of the transformer 86) is four times the output impedance presented by the network 72. Taking the output impedance of the network 72 as being 25 ohms, each input impedance presented to the transformer 86 is 100 ohms. Since the output of the transformer 86 is balanced with respect to the input thereof, it will be appreciated that the output impedance from the network 18 is returned to 50 ohms.

The output coupling network 20 may be similar to the network 18. The impedance transformation ratios will be such that the 100 ohms load impedance will be matched to the 50 ohms impedance at the output of the network 18.

From the foregoing description it will be apparent that there has been provided an improved amplifier system which permits high-power output to be obtained by virture of combining the outputs of many transistors, each of which in and by itself may only be capable of handling relative low power. By virtue of each of the coupling networks the output of these transistors may be combined and signals may be applied to their input in a manner by which broad band operation is made possible. Variations and modifications of the illustrated amplified systems and components therefore, will, undoubtedly, become apparent to those skilled in the art. Accordingly the foregoing description should be taken as illustrative and not in any limiting sense.

What is claimed is:

1. An amplifier which comprises (a) a plurality of amplifier stages each having an input and an output, (b) means for applying an input signal to be amplified to parallel to all of said stage inputs, (c) a plurality of first hybrid combining circuits each connected to the outputs of two different ones of said stages for providing a plurality of first combined outputs, (d) a plurality of coupling networks, each containing a second hybrid combining circuit connected to two different ones of said combined outputs for providing a plurality of second combined outputs, (e) an output coupling network connected to the second combined outputs and containing a third hybrid combining circuit adapted to be coupled to a load, (f) said first, second and third hybrid combining circuits each comprising a transformer having a pair of windings connected in series aiding relationship between the inputs thereto and providing said first combined output at the junction of said transformer, and (g) said coupling networks each including, in addition to said hybrid circuit transformer, first and second coupling transformers, a first winding of said first coupling transformer and a first winding of said second coupling transformer are connected respectively to said different ones of said first combined outputs, and a second winding of said first transformer and a second winding of said second transformer being connected respectively to different ones of said pair of windings of said hybrid circuit transformer.

2. The invention as set forth in claim 1 wherein oppositely polarized ends of said first and second windings of said first transformer are connected to each other to provide a first auto-transformer, and wherein oppositely polarized windings of said second transformer are connected to each other to provide a second auto-transformer.

3. The invention as set forth in claim 2 wherein said input signal applying means includes a plurality of fourth hybrid circuits, each corresponding to a different one of said first hybrid combining circuits, and connected to the inputs of the same different ones of said stages as their corresponding first hybrid combining circuits for driving said last named stages in phase with each other.

4. The invention as set forth in claim 3 wherein said fourth hybrid circuit includes a first transformer and a second transformer, means for connecting the windings of said first transformer in series aiding relationship with respect to the source of the input signals to be amplified, a resistor having a resistance equal to the output impedance of said source connected in series with said first transformer windings at the end thereof opposite to said source connected end and a second transformer having a pair of windings each connected to an opposite end of the one of said series connected windings which is connected to said source, means for connecting one of said stage inputs to the opposite end of one of said second transformer windings and the junction of said series connected first transformer windings to the other of said stage inputs.

5. The invention as set forth in claim 4 wherein each of said stages includes a single low power transistor amplifier.

6. The invention as set forth in claim 1 wherein a resistor is connected directly between the said inputs of said windings of said transformers in said first, second and third hybrid combining circuits to which said windings are connected.

References Cited

UNITED STATES PATENTS

| | | | |
|---|---|---|---|
| 3,030,501 | 4/1962 | Rapuano | 333—11 X |
| 3,202,927 | 8/1965 | Ishimoto et al. | 330—124 X |
| 3,263,179 | 7/1966 | Bosselaers et al. | 330—124 X |
| 3,317,849 | 5/1967 | Smith-Vaniz | 330—21 |

ROY LAKE, *Primary Examiner.*

J. B. MULLINS, *Assistant Examiner.*

U.S. Cl. X.R.

330—167; 333—11